(12) United States Patent
Tsai

(10) Patent No.: US 6,342,833 B2
(45) Date of Patent: Jan. 29, 2002

(54) APPARATUS FOR DISPLAYING ELECTRICAL MEASUREMENT OF DISTRIBUTOR OF MOTOR VEHICLE

(75) Inventor: Liao-Tai Tsai, Taipei (TW)

(73) Assignee: Real Power Cap Company, Taipei (TW)

( * ) Notice: Subject to any disclaimer, the term of this patent is extended or adjusted under 35 U.S.C. 154(b) by 0 days.

(21) Appl. No.: 09/862,489

(22) Filed: May 23, 2001

Related U.S. Application Data

(63) Continuation of application No. 09/484,541, filed on Jan. 18, 2000.

(51) Int. Cl.$^7$ ................................................. B60Q 1/00
(52) U.S. Cl. ...................... 340/439; 340/660; 340/664; 340/691.6; 340/815.44; 340/815.45
(58) Field of Search ............................... 340/438, 439, 340/635, 641, 660, 664, 691.6, 815.45, 815.44

(56) References Cited

U.S. PATENT DOCUMENTS

| | | | | |
|---|---|---|---|---|
| 3,946,309 A | * | 3/1976 | Hasbrouck | .................. 324/384 |
| 4,312,043 A | * | 1/1982 | Frank et al. | ................. 701/102 |
| 4,817,418 A | * | 4/1989 | Asami et al. | ............... 73/118.1 |
| 4,977,391 A | * | 12/1990 | Coquerel | .................... 340/522 |
| 5,233,227 A | * | 8/1993 | Kajimoto et al. | ............ 307/9.1 |

* cited by examiner

Primary Examiner—Daniel J. Wu
(74) Attorney, Agent, or Firm—Birch, Stewart, Kolasch & Birch, LLP

(57) ABSTRACT

An apparatus for displaying electrical measurement of distributor of motor vehicle comprises a distributor and a circuit module including at least one display unit and a circuit board in distributor under input and output terminals and electrically connected thereto by contacting. Display unit is electrically connected to circuit board and located on a side of distributor for ease of reading. Thus current representing an electrical measurement of distributor may be shown on display unit.

14 Claims, 10 Drawing Sheets

US 6,342,833 B2

APPARATUS FOR DISPLAYING ELECTRICAL MEASUREMENT OF DISTRIBUTOR OF MOTOR VEHICLE

CROSS-REFERENCE TO RELATED APPLICATION

The present application is a continuous application of U.S. patent application Ser. No. 09/484,541 filed Jan. 18, 2000 entitled "Apparatus for Displaying Electrical Measurement of Distributor of Motor Vehicle." The teaching thereof is incorporated herein by reference.

BACKGROUND OF THE INVENTION

1. Field of Invention

The present invention relates to the distributor of motor vehicles, and more particularly to an apparatus for displaying electrical measurements of distributors of motor vehicles, so that user may see the desired electrical measurement directly, thereby eliminating the need to use a multimeter for detecting a malfunctioned component.

2. Related Art

Conventionally, power supplied by battery 20 of a motor vehicle is distributed to the electrical devices such as stereo, head light, directional light, and brake light, etc. by a distributor. Above related Patent Application discloses a circuit module in addition to distributor. The circuit module comprises at least one display unit, a circuit board, and a plurality of flexible pins wherein pins are electrically connected between circuit module and distributor such that circuit board may be enabled by the power supplied by distributor through the pins. Further, an appropriate representation is displayed on the display unit. Hence, user may see the desired electrical measurement on the display unit directly, thereby eliminating the need to use a multimeter for detecting a malfunctioned component.

As best illustrated in FIG. 1, a plurality of pins 60 are between circuit module 40 and distributor 10. Hence, manufacturing cost is increased due to the provision of circuit board 43, display unit 412 and pins 60. Further, in assembly it is required to first mount pins 60. Then mount circuit board 43 on pins 60. Furthermore, user has to bend the back in order to see electrical measurement on display unit 412 clearly which is mounted on distributor 10. As shown in FIG. 2, if fuse is melted user has to open cover 12 prior to detaching circuit board 43. Thereafter, it is possible to replace the melted fuse with a good one. Finally, mount circuit board 43 and cover 12 sequentially. In view of this, it is inconvenient in use and quite bothering.

SUMMARY OF THE INVENTION

It is therefore an object of the present invention to provide an apparatus for displaying electrical measurement of distributor of motor vehicle such that user may see desired electrical measurement directly, thereby eliminating the need to use a multimeter for detecting a malfunctioned component.

The advantages of the present invention are realized by providing an apparatus for displaying electrical measurement of distributor of motor vehicle comprising a distributor and a circuit module. Circuit module comprises at least one display unit and a circuit board. Circuit board is provided in distributor under input and output terminals and electrically connected thereto by contacting. Display unit is electrically connected to circuit board and located on a side of distributor. Hence, current may be shown on display unit via circuit board and thus eliminating pins which is connected to circuit module as disclosed in the related Patent Application. As an end, the manufacturing cost is reduced and assembly is further simplified. Preferably, display unit is slanted or mounted on the side of the display unit for ease of reading. Moreover, circuit module is mounted within distributor. Thus user may replace a malfunctioned fuse with a good one without detaching circuit module.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become fully understood from the detailed description given hereinbelow illustration only, and thus are not limitative of the present invention, and wherein.

DETAILED DESCRIPTION OF THE INVENTION

Figure 1:
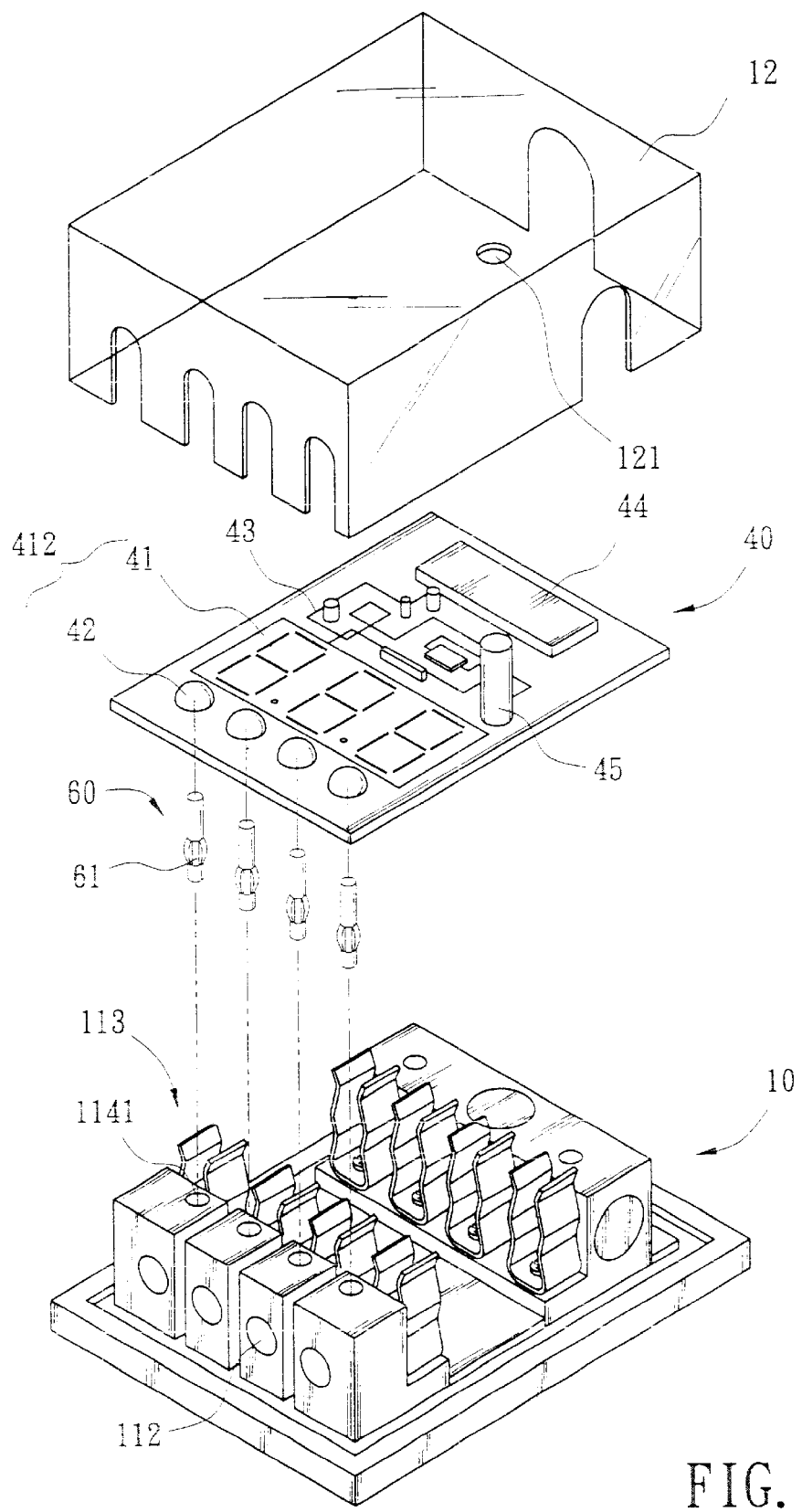
FIG. 1 is an exploded view illustrating a referenced apparatus for displaying electrical measurement of distributor of motor vehicle.
Figure 2:
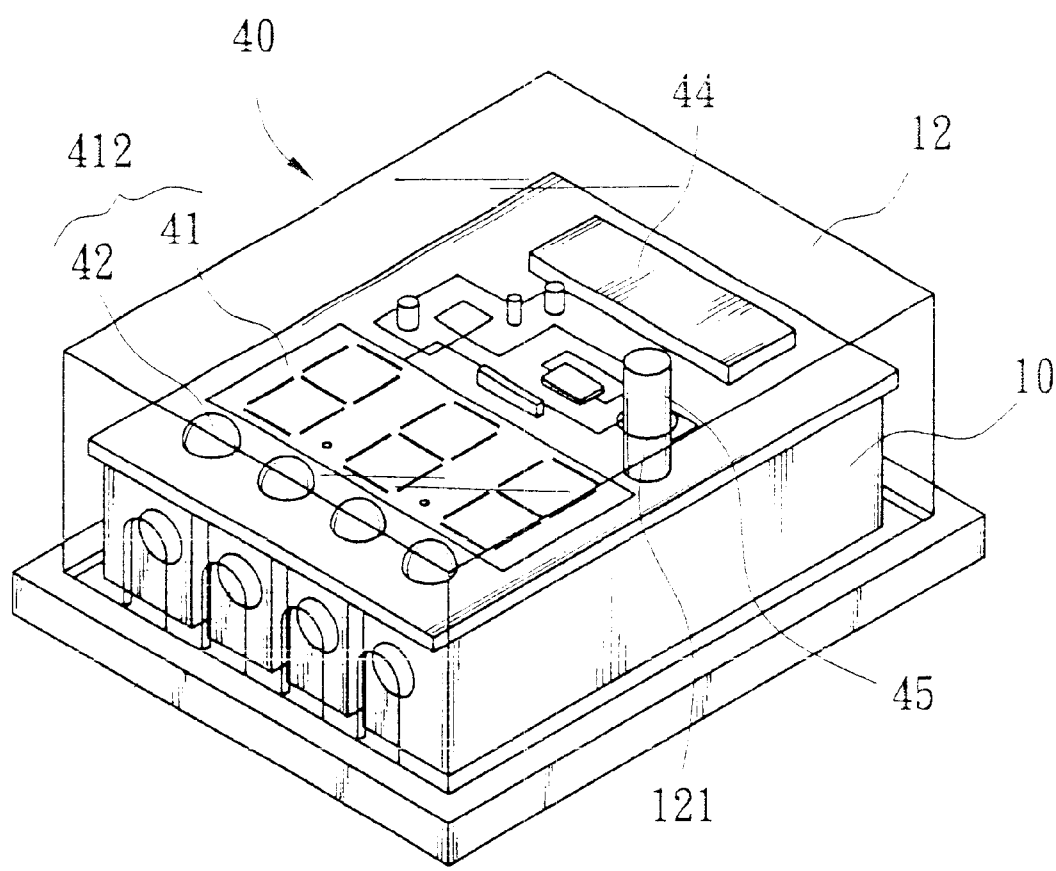
FIG. 2 is a perspective view of the assembled FIG. 1 apparatus.
Figure 3:
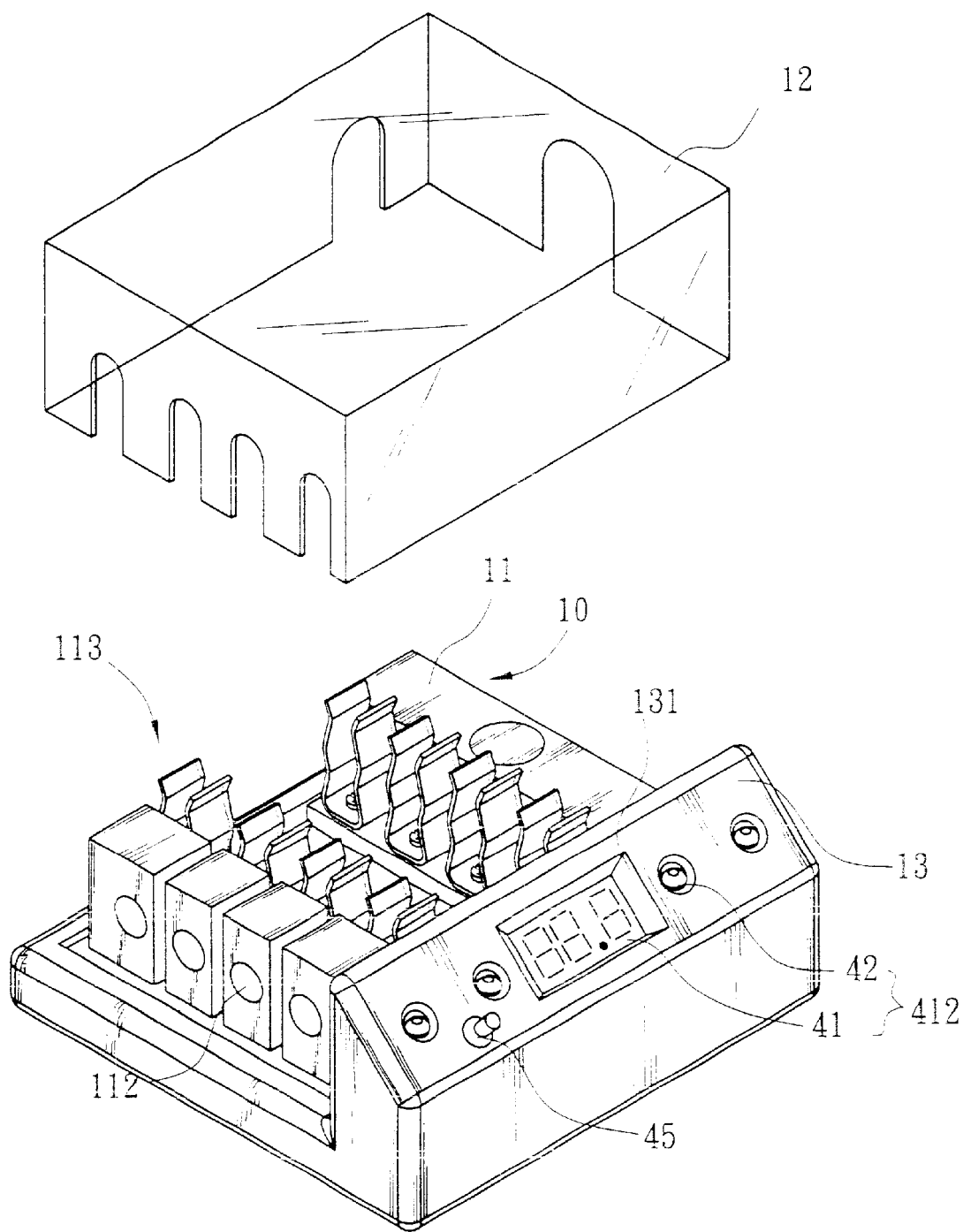
FIG. 3 is a perspective view of a first preferred embodiment of apparatus for displaying electrical measurement of distributor of motor vehicle according to the invention where cover is removed.
Figure 4:
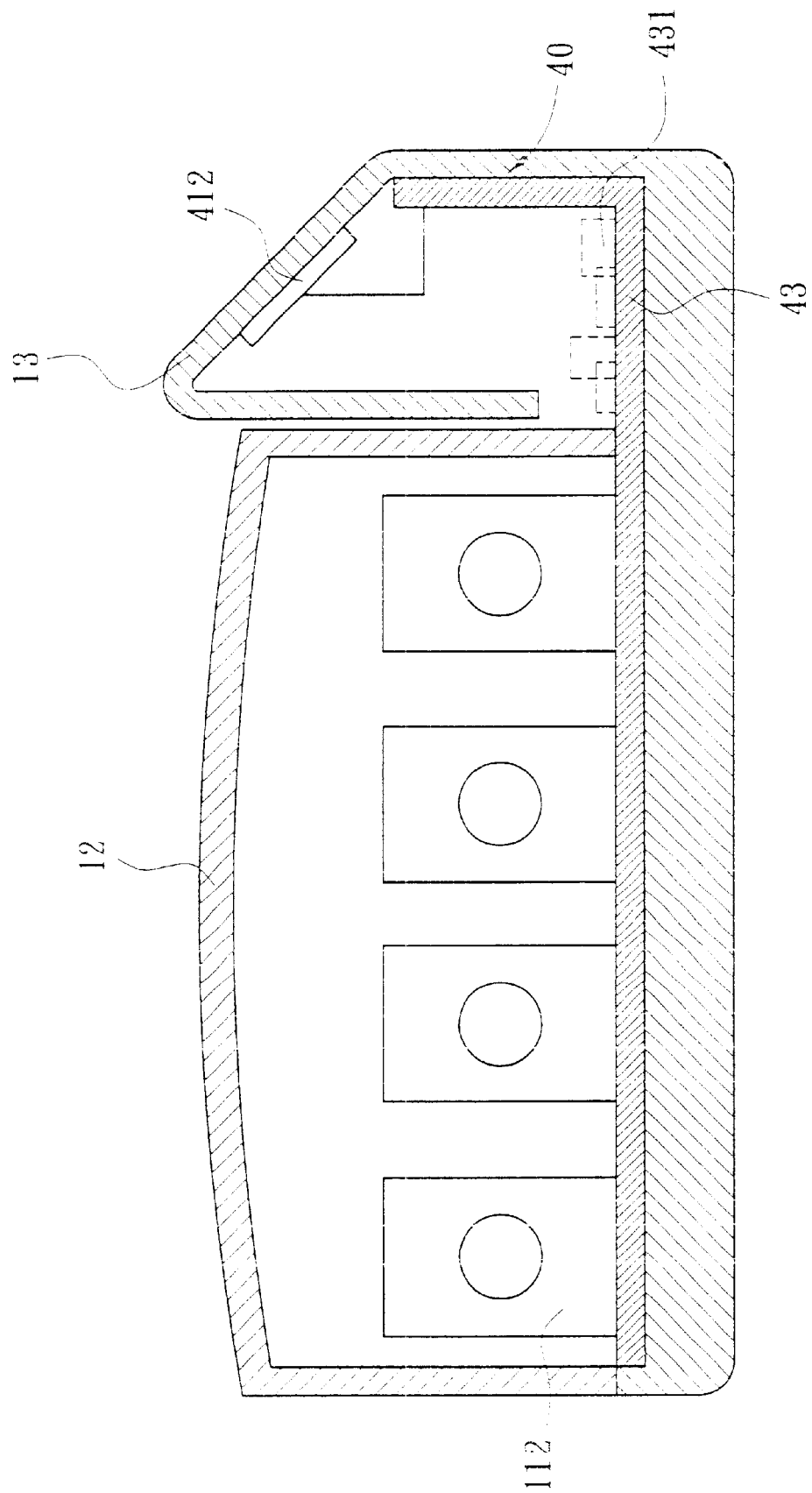
FIG. 4 is a sectional view of the assembled apparatus shown in FIG. 3.

Referring to FIGS. 3 to 6 in conjunction with FIGS. 1 and 2 a first embodiment of an apparatus of the invention is illustrated. The apparatus comprises a distributor 10 and a circuit module 40. Distributor 10 includes an input terminal 111, a plurality of output terminals (four are shown for the purpose of illustration) 112, a cover 12 for preventing dust and foreign bodies from entering the distributor 10, and a plurality of fuse blocks 113 having fuses with each fuse block 113 provided in the connection (i.e., branch) between input terminal 111 and an associated output terminal 112 as a safeguard for preventing overload. Circuit module 40 comprises at least one display unit 412 and a circuit board 43. Circuit board 43 is provided in distributor 10 under input terminal 111 and output terminals 112 and electrically connected thereto by contacting. Display unit 412 is electrically connected to circuit board 43 and located on a side of distributor 10. Hence, current may be shown on display unit 412 via circuit board 43 and thus eliminating pins disclosed in the related Patent Application. As an end, the manufacturing cost is reduced and assembly is further simplified. Circuit board 43 is shaped like an L so that display unit 412 can be mounted on a side of distributor 10. It is appreciated that circuit board 43 may have any other shape in other embodiments as long as circuit board 43 is under input terminal 111 and output terminals 112. Further, display unit 412 is in front of circuit board 43. A casing 13 is extended from a side of distributor 10 for protecting circuit module 40. A window 131 is on top of casing 13 so that user may see the desired electrical measurement shown on display unit 412 directly. Preferably, display unit 412 on top of casing 13 is slanted at a desired angle for ease of reading. Moreover, display unit 412 may be provided on the other side of distributor 10 (i.e., left as seen in FIG. 3 while top and bottom sides are provided for input/output.)

Figure 5A:
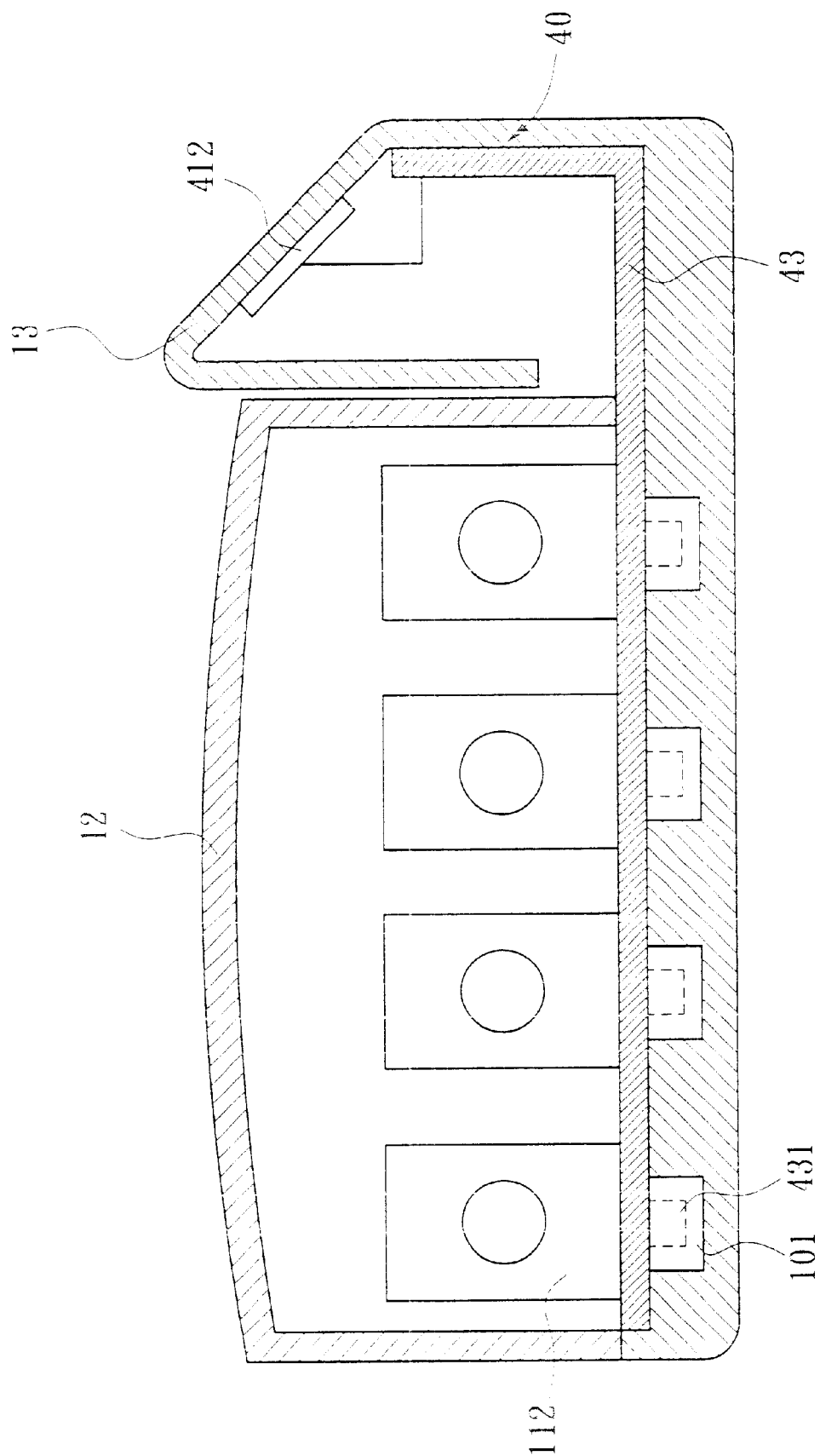
FIGS. 5A and 5B are views similar to FIG. 4 schematically illustrating an electrical connection between circuit board and distributor.
Figure 5B:
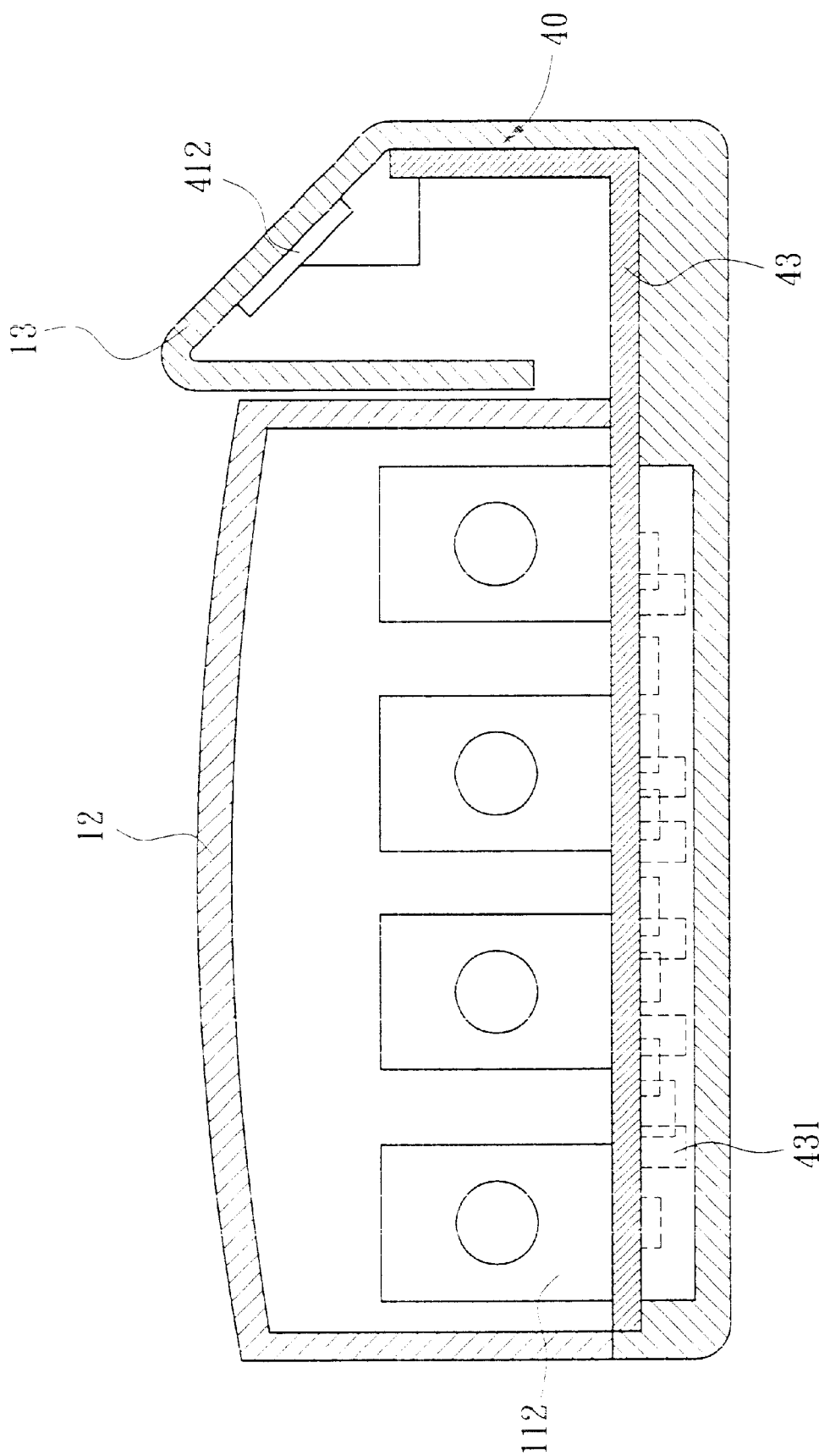

Moreover, circuit board 43 is mounted within distributor 10. Electrical elements 431 such as ICs, capacitors, resistors, etc. may be provided in casing 13 in the right side of distributor 10 since there are sufficient space in casing 13 for mounting such elements 431 (FIG. 3). In FIG. 5A, a plurality of rectangular slots 101 are provided on bottom of distributor 10 for receiving electrical elements 431. Alternatively in FIG. 5B, a recess is provided on bottom of distributor 10 for receiving electrical elements 431. In either of above configurations shown in FIGS. 5A and 5B, the depth and size of slot 101 or recess may be designed to conform to the mounted electrical elements 431.

Figure 6A:
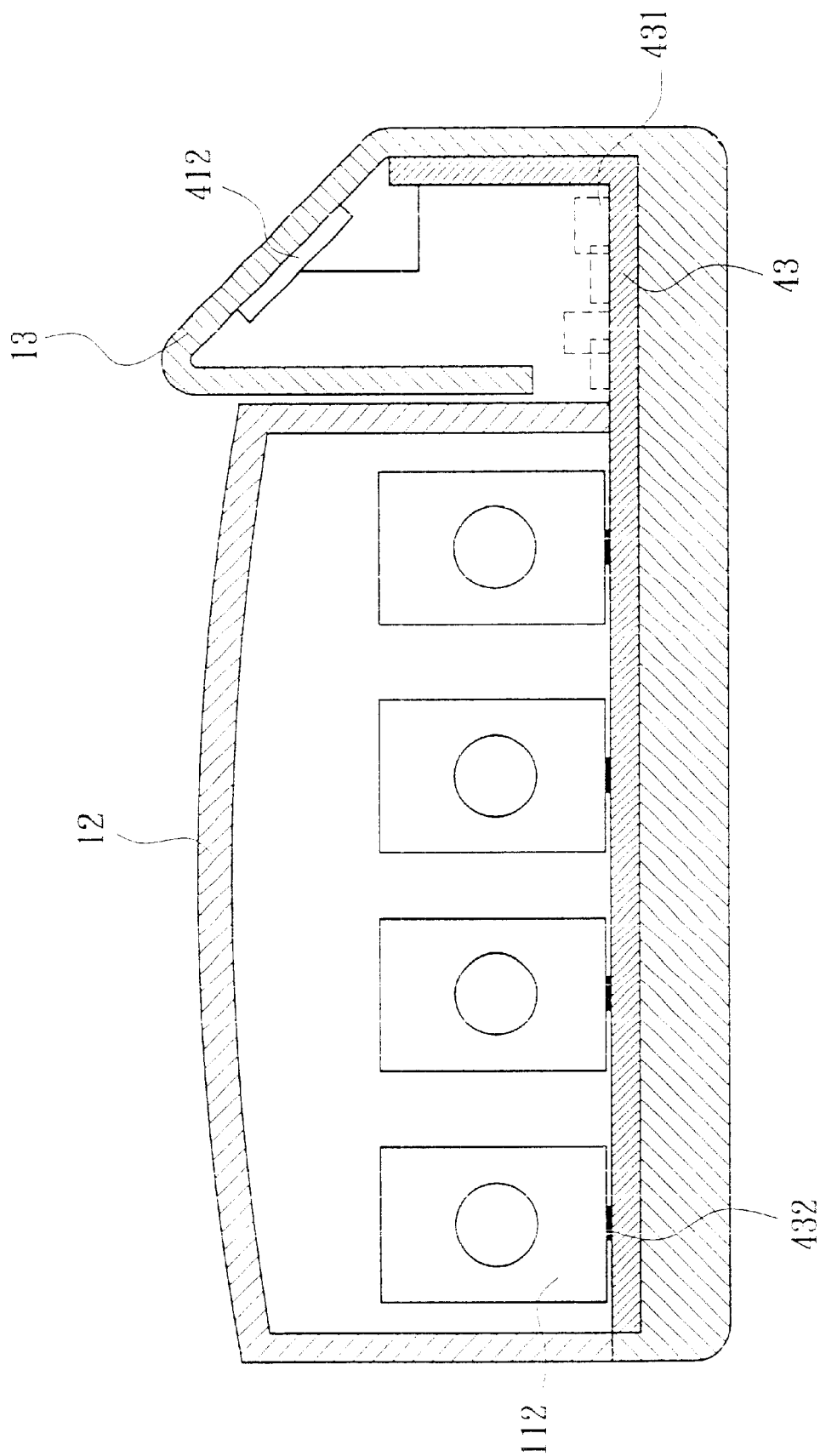
FIGS. 6A and 6B are views similar to FIGS. 5A and 5B schematically illustrating an electrical connection between output terminal and circuit board.
Figure 6B:
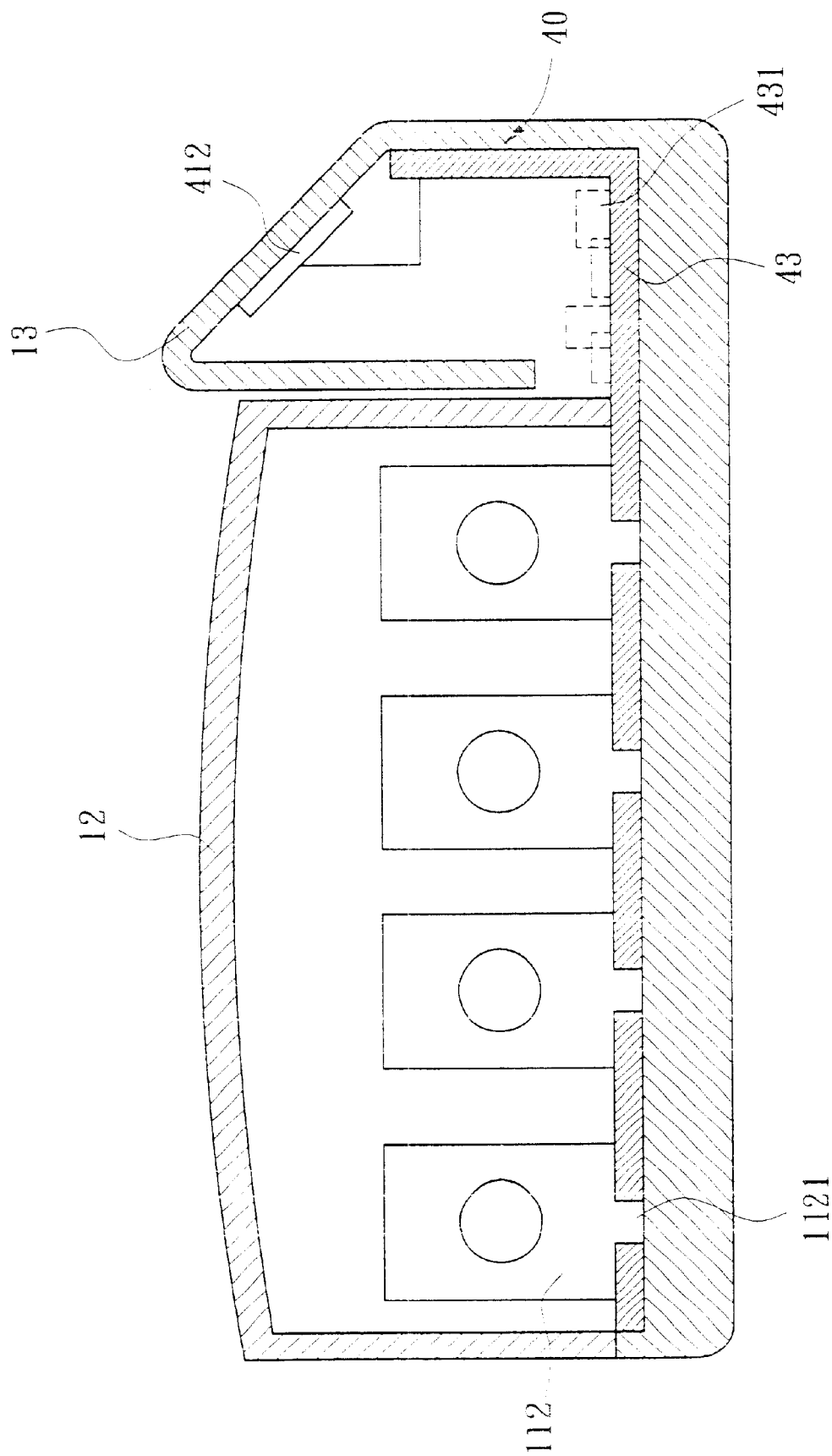

FIG. 6A illustrates an electrical connection between each output terminal 112 and circuit board 43. In detail, output terminal 112 is coupled to a contact 432 of circuit board 43 for establishing an electrical connection. Contact 432 may be a welded spot, exposed lead, or the like. The electrical connection between input terminal 111 and circuit board 43 is similarly configured as that between each output terminal 112 and circuit board 43. Thus a description of such is omitted for the sake of brevity. Hence, current may be shown on display unit 412 via circuit board 43. In addition, a riser 1121 is provided on bottom of output terminal 112 (FIG. 6B). Riser 1121 is projected from a hole on circuit board 43 for forming an electrical connection between output terminal 112 and circuit board 43. Hole on circuit board 43 is electrically connected to circuitry of circuit board 43, or alternatively a plurality of electrical contacts are around hole on circuit board 43. Above are only exemplary embodiments for forming an electrical connection between each output terminal 112 and circuit board 43. It is appreciated that such connection may have any other form in other embodiments without departing from the spirit and scope of the invention.

The display unit 412 is implemented as a plurality of light emitting diodes (LEDs) 42 each corresponding to a fuse block 113 on the distributor 10. An on/off or a selected color (i.e., green means normal, red means abnormal, etc.) may be used to represent whether a corresponding fuse is normal or not. Optionally, a liquid crystal display (LCD) 41 may be provided to display current or voltage value of distributor 10 in a digital manner. Further, a button 45 (FIG. 3) is provided on the circuit module 40 for user to conveniently switch between voltage and current values, or show current of a branch. It is understood that branches are connected parallel. Hence, all branches have the same voltage, while current may be different depending on the resistance value of respective branch.

As shown in FIG. 1, user may replace a malfunctioned fuse in fuse block 113 with a good one by removing cover 12 without detaching circuit board as disclosed in the related Patent Application since circuit module 40 is under input terminal 111 and output terminals 112. This is quite convenient.

Figure 7:
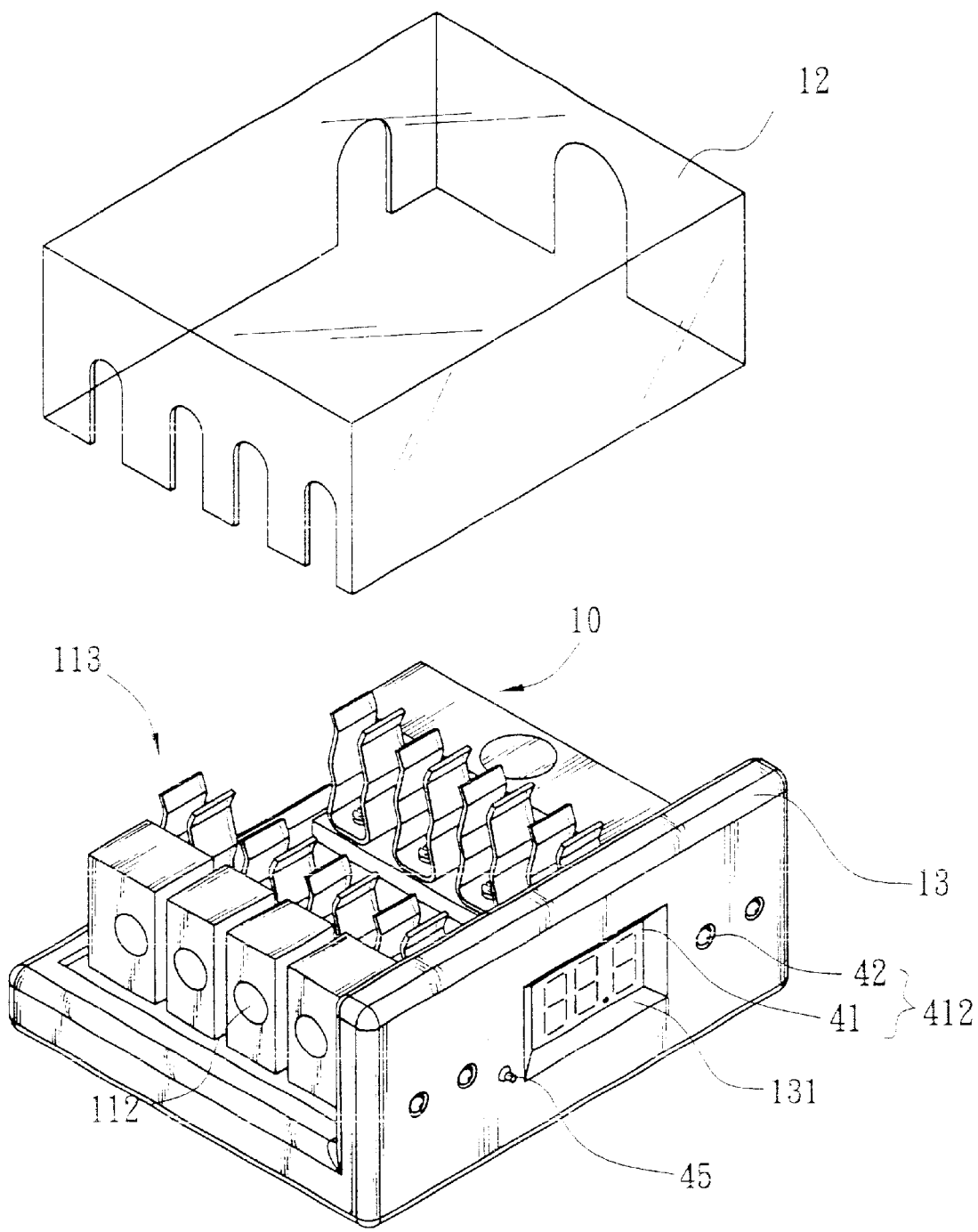
FIG. 7 is a perspective view of a second preferred embodiment of apparatus for displaying electrical measurement of distributor of motor vehicle according to the invention where cover is removed.
Figure 8:
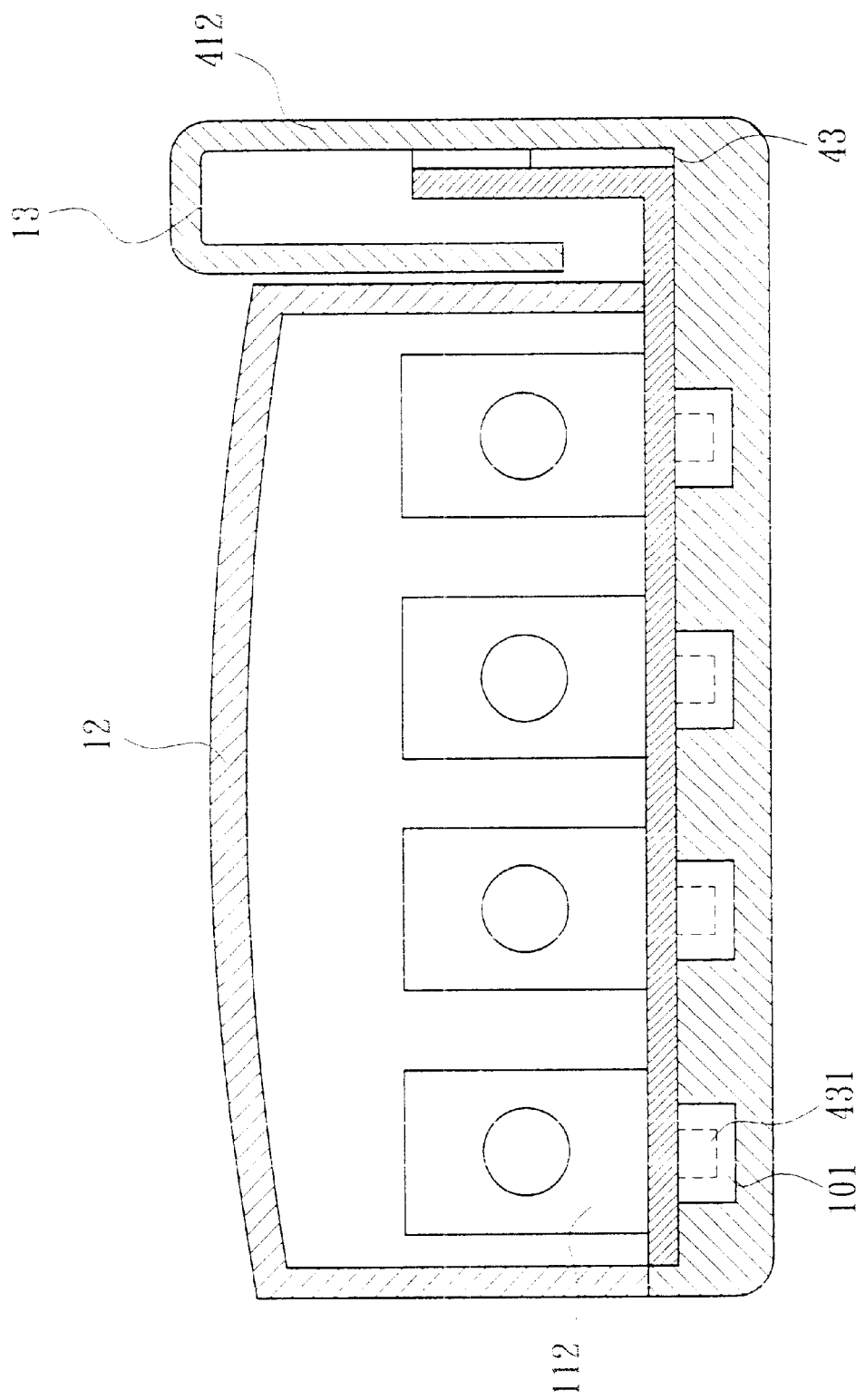
FIG. 8 is a sectional view of the assembled apparatus shown in FIG. 7.

Referring to FIGS. 7 and 8, a second embodiment of an apparatus of the invention is illustrated. The features of the second embodiment are that display unit 412 is provided on a side of distributor 10, i.e., the vertical wall to the right of output terminals 112 as shown. This may also facilitate reading the desired electrical measurement shown on display unit 412 which is provided to the right of circuit board 43. Similarly, display unit 412 may comprises a plurality of LEDs 42 and an LCD 41 for displaying current or voltage value of distributor 10. Further, a button 45 (FIG. 7) is provided on the circuit module 40 for user to conveniently switch between voltage and current values, or show current of a branch. As stated above, display unit 412 is provided on the side of distributor 10 rather than disposed at an angle with respect thereto (i.e., slanted). Hence, space to the right of distributor 10, i.e., inner space of casing 13 is reduced. The total space of the apparatus is reduced accordingly (FIG. 8). Thus there is not sufficient space inside casing 13 to receive electrical elements 431 of circuit board 43. A solution to this is to provide a plurality of rectangular slots 101 on bottom of distributor 10 for receiving electrical elements 431 (FIG. 5A). Alternatively in FIG. 5B, a recess is provided on bottom of distributor 10 for receiving electrical elements 431.

Also, an electrical connection between each output terminal 112 (or input terminal 111) and circuit board 43 is effected by contacting. In detail as shown in FIG. 4A, output terminal 112 is coupled to a contact 432 of circuit board 43 for establishing an electrical connection. Contact 432 may be a welded spot, exposed lead, or the like. Hence, current may be shown on display unit 412 via circuit board 43. In addition, a riser 1121 is provided on bottom of output terminal 112 (FIG. 6B). Riser 1121 is projected from a hole on circuit board 43 for forming an electrical connection between output terminal 112 and circuit board 43. Hole on circuit board 43 is electrically connected to circuitry of circuit board 43, or alternatively a plurality of electrical contacts are around hole on circuit board 43. Above are only exemplary embodiments for forming an electrical connection between output terminal 112 and circuit board 43. It is appreciated that such connection may have any other form in other embodiments without departing from the spirit and scope of the invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for displaying electrical measurement of electrical means of a motor vehicle comprising:

a distributor for distributing power to said electrical means having an input terminal and a plurality of output terminals; and a circuit module including at least one display unit and a circuit board;

wherein said circuit board is provided in said distributor under said input and output terminals and is electrically connected thereto by contacting, and said display unit is electrically connected to said circuit board and is located on a side of said distributor, thereby showing current representing an electrical measurement of said distributor on said display unit via circuit board.

2. The apparatus of claim 1, wherein said distributor comprises a plurality of fuse blocks each provided in a branch of said distributor.

3. The apparatus of claim 1, wherein said display unit comprises a plurality of light emitting diodes (LEDs).

4. The apparatus of claim 3, wherein said display unit further comprises a digital display.

5. The apparatus of claim 4, wherein said digital display is a liquid crystal display (LCD).

6. The apparatus of claim 4, wherein said circuit module further comprises a button being operative to switch values shown on said digital display.

7. The apparatus of claim 1, further comprising a casing extended from a side of said distributor and a window on said casing disposed corresponding to said display unit.

8. The apparatus of claim 7, wherein said display unit is disposed vertically on a side of said distributor.

9. The apparatus of claim 7, wherein said display unit is disposed slantwise on said side of said display unit.

10. The apparatus of claim 9, wherein said circuit board comprises a plurality of electrical elements in said casing.

11. The apparatus of claim 10, wherein said electrical elements are under said circuit board.

12. The apparatus of claim 11, further comprising a plurality of slots on bottom of said distributor for receiving said electrical elements.

13. The apparatus of claim 11, further comprising a recess on bottom of said distributor for receiving said electrical elements.

14. The apparatus of claim 1, wherein said distributor further comprises a cover.

* * * * *